United States Patent [19]

Lüdeke et al.

[11] Patent Number: 5,475,306
[45] Date of Patent: Dec. 12, 1995

[54] SQUID MAGNETIVITY HAVING A TOTALLY ENCLOSING ELECTROMAGNETIC SHIELD WITH A PREDETERMINDED SHEET RESISTANCE FOR LOW NOISE

[75] Inventors: Kai-Michael Lüdeke, Hamburg; Olaf Dössel, Tangstedt; Jürgen Köhler, Halstenbek, all of Germany

[73] Assignee: U.S. Philips Corporation, New York, N.Y.

[21] Appl. No.: 110,036

[22] Filed: Aug. 20, 1993

[30] Foreign Application Priority Data

Aug. 22, 1992 [DE]  Germany ........................ 42 27 878.3

[51] Int. Cl.$^6$ ..................... G01R 33/035; H01F 15/04
[52] U.S. Cl. .................. 324/248; 324/262; 336/84 C; 505/702; 505/846
[58] Field of Search ................. 324/248, 244, 324/262; 336/84 R, 84 M, 84 C; 505/702, 846

[56] References Cited

U.S. PATENT DOCUMENTS

| | | | |
|---|---|---|---|
| 4,761,611 | 8/1988 | Hoenig | 324/248 |
| 4,994,479 | 2/1991 | Hoenig | 324/248 |
| 5,049,818 | 9/1991 | Dössel et al. | 324/248 |
| 5,061,680 | 10/1991 | Paulson et al. | 324/248 |
| 5,158,932 | 10/1992 | Hinshaw et al. | 324/248 X |
| 5,243,281 | 4/1993 | Ahonen et al. | 324/248 |
| 5,265,611 | 11/1993 | Hoenig et al. | 324/274 |
| 5,293,119 | 3/1994 | Podney | 324/248 X |

FOREIGN PATENT DOCUMENTS 04012420  12/1990  European Pat. Off. .
62-17568   8/1987  Japan .

OTHER PUBLICATIONS

"A Modular Low Noise 7–Channel Squid–Magnetometer", IEEE Trans. of Magnetics, vol. 27, No. 2, Mar. 1991, P. 2797–2800.

"Johnson Noise From Normal Metal Near A Superconducting Squid Gradiometer Circuit", IEEE Trans. of Magnetics, vol. 23, No. 2, Mar. 1987, pp. 1093–1096.

"Thermal Noise of a Biomagnetic Measurement Dewar, Advances in Biomagnetism", pp., 729–732, No Month 1989.

"Biomagnetic Instrumentation", G. L. Romani et al, Review of Scientific Instruments, BD. 53, No. 12, Dec. 1982, pp. 1815–1845.

Primary Examiner—Sandra L. O'Shea
Assistant Examiner—Warren S. Edmonds
Attorney, Agent, or Firm—Jack D. Slobod

[57] ABSTRACT

A shielding sleeve (19) for SQUID-magnetometers which serves to shield from electromagnetic interference fields, consists of an electrically conductive shielding material so as to obtain adequate RF shielding in conjunction with a low noise contribution, completely envelops a non-shielding cryostat (10), has a predetermined sheet resistance and consists of at least one layer of the shielding material in order to avoid an increase of the magnetometer overall noise.

10 Claims, 1 Drawing Sheet

SQUID MAGNETIVITY HAVING A TOTALLY ENCLOSING ELECTROMAGNETIC SHIELD WITH A PREDETERMINDED SHEET RESISTANCE FOR LOW NOISE

BACKGROUND OF THE INVENTION

1. Field of the Invention

The invention relates to a SQUID-magnetometer, comprising a shielding sleeve which serves to shield the magnetometer from electromagnetic interference fields and which consist of an electrically conductive shielding material.

2. Description of the Related Art

The SQUIDs used in known SQUID-magnetometers, for example as described in "A modular low noise 7-channel SQUID-magnetometer", IEEE Transactions of Magnetics, Vol. 27, No. 2, March 1991, pp. 2797–2800 are not only responsive to the magnetic field to be measured but also sensitive to electric interference fields because of their non-linear current-voltage characteristic with curvature in the microvolt range.

The supply leads to the SQUID act as short aerials which transport, for example RF signals from broadcast transmitters or the interference radiation from computers to the SQUID and influence its operation as a magnetic field sensor or even prevent such operation in the case of high field strengths. Filters cannot be inserted between the SQUID and the supply leads, as the control and measurement signals of the SQUID themselves are of a high frequency nature because of the typical flux and bias modulation methods. If no further steps are taken, therefore, operation of a SQUID-magnetometer is possible only within a shielded measurement chamber constructed as a Faraday cage. Because of the interference radiation produced thereby a variety of customary electronic measurement apparatus cannot be used in the same measurement chamber in which the SQUID-magnetometer is also arranged. After persons have entered and/or left the measurement chamber, prior to the start of measurement them must be observed a waiting period during which the working points of the SQUIDs and the downstream electronic circuitry, having been shifted by the interference radiation penetrating the chamber when the door is open, can assume the correct values again.

The sensitivity of SQUID-magnetometers to electric noise, therefore, should be reduced to such an extent that the described restrictions are eliminated by constructing the cryostat itself as a Faraday cage. To this end, the cryostat should be enveloped by a closed metallic envelope. In addition to the desired shielding effect, however, two other physical effects which can in principle influence the magnetic field measurement then become manifest.

Magnetic fields which vary in time, for example the biomagnetic signals to be measured, excite eddy currents in such a metal envelope, which eddy currents falsify the magnitude and the spatial variation of the magnetic field within the cryostat at the area of the SQUID. Furthermore, free electrons in the metal envelope perform the so-called Brownian movement, thus generating thermal magnetic field noise which reduces the sensitivity of the SQUID-magnetometer.

The magnetic field distortions by eddy currents can be exactly calculated for simple shield geometries by means of the methods disclosed in the book "Eddy Currents in Linear Conducting Media", Elsevier Science Publishers B.V. 1985; for more complex shapes they can be sufficiently accurately estimated by such methods.

Methods for determining the magnetic field noise of normally conductive metals in the vicinity of magnetometers and gradiometers are known, for example from the article "Johnson noise from normal metal near a superconducting SQUID gradiometer circuit", IEEE Transactions of Magnetics, Vol. 23, No. 2, March 1987, pp. 1093–1096, and from the article "Thermal noise of a biomagnetic measurement dewar, Advances in Biomagnetism", 1989, pp. 729–732. The aluminium foil used according to the latter article has a comparatively large thickness so that, in order to avoid excessive noise, it is provided within the cryostat in the form of separate, slab-like portions instead of a continuous foil. However, due to this subdivision complete RF shielding is no longer obtained. Furthermore, it is not possible to provide a shield at a later stage.

From the Abstract JP-A-62-175681 there is known a high-frequency shield in the form of an aluminium foil which is arranged within an outer wall of a double-walled cryostat. However, the foils are not interconnected so as to form a closed sleeve, so that the desired shielding effect of a closed sleeve cannot be achieved.

From EP-A1-0 401 420 there is known an RF shield which is arranged inside a dewar vessel and which has an elaborate construction consisting of a plurality of parts of partly complex structure which must be manufactured and assembled in a plurality of operations. In order to avoid an increase of the system noise due to thermal eddy currents in the shielding material, the shield is not closed at the area of highest sensitivity, i.e. at the gradiometers, because substantially complete enclosure of a SQUID system by a closed metal surface causes thermally induced eddy currents, as can be deduced from EP-A 1-0 401 420, which eddy currents are linked to degradation of the signal-to-noise ratio. At the area of the superconducting parts, the RF shield is, therefore, subdivided into single, electrically conductive tracks which are insulated from one another, so that the shielding effect, of course, is degraded again.

Therefore, it is an object of the invention to provide a shielding sleeve which is to be provided around the cryostat, has given properties, and ensures adequate RF shielding as well as an acceptably low noise contribution.

This object is achieved in accordance with the invention in that the shielding sleeve fully encloses a non-shielding cryostat, at a predetermined sheet resistance, and is composed of at least one layer of the shielding material so that an increase of the overall magnetometer noise is avoided as well as possible.

Further preferred embodiments of the invention are disclosed in the dependent claims.

On the basis of the cited literature, the two effects mentioned can be reduced to a sheet resistance $R=1/(s;t)$ in the case of thin metallic layers, where s is the conductivity and t is the layer thickness of the shielding material.

Since conductivity is the quantity of electricity that will flow through a unit cube of a given substance in a unit of time and is also the reciprocal of resistivity, sheet resistance R may be expressed as a resistance (such as milliohms) per unit square, or $m\Omega/\square$.

On the basis of a calculation of the field noise in a cryostat, for example as described hereinafter with reference to FIG. 1 and provided with a copper shielding sleeve having a thickness of, for example 35 µm as is known from prior art, it can be demonstrated that this foil, having a sheet resistance of approximately $R=0.45$ $m\Omega/\square$, leads to large distortions (in the range of percents) at frequencies up to 100 Hz, but notably to excessive magnetic field noise. Using this sleeve for the cryostat to be shielded, a noise flux corresponding to a field noise of approximately 40 fT/Hz$^{1/2}$ (= $40.10^{-15}$ T/Hz$^{1/2}$) is induced in the coil of the gradiometer which faces the cryostat and which is situated at a distance of from approximately 1 to 2 cm from the lower side of the cryostat end which is shaped as a spherical segment, approximately 37 fT thereof stemming from the sphere and 13 fT from the cylindrical part of the lower end of the cryostat. Because of the larger distance, the other parts of the shielding sleeve of the cryostat already contribute substantially less to the overall noise.

In the case of, for example an axial gradiometer, the overall noise flux at the gradiometer terminal is slightly smaller than the field noise calculated above. In the case of a lateral gradiometer, it may also be greater.

In SQUID-magnetometers, however, usually an equivalent system noise below 20 fT/Hz$^{1/2}$ is pursued in order to obtain useful measurement results.

In the SQUID-magnetometers known from the cited article "A modular low noise 7-channel SQUID-Magnetometer", even 10 fT/HZ$^{1/2}$ is achieved in the absence of RF interference. The following procedure can be adopted in order to obtain a surface resistivity which offers adequate RF shielding as well as an acceptably low noise contribution for a shielding sleeve in accordance with the invention which is to be arranged around the cryostat.

Using the same geometry, the noise contribution is proportional to $1/R^{1/2}$. When a small increase of the system noise due to the RF shielding sleeve is allowed, for example by only 10%, the noise contribution by the shielding sleeve should be reduced to 46% of the basic noise. This is because the noise contributions are added in a square law manner. For the above 10 fT/Hz$^{1/2}$ system, the noise contribution due to the RF shielding sleeve must not exceed 4–5 fT/Hz$^{1/2}$. For the 10% increase, this is achieved in accordance with the invention by means of a sheet resistance of the shielding sleeve in the range of from approximately 50 to 70mΩ/□. The magnetic field distortions caused by eddy currents are then also negligibly small. The range of the required sheet resistance changes in a corresponding manner for a different permissible increase.

This sheet resistance can be realised, for example by means of foils of a synthetic material or by metal foils of copper, having a thickness of approximately 0.3 μm, or aluminium having a thickness of approximately 0.6 μm. However, it is to be noted that metal foils have the drawback that the formation of a closed sleeve on usually complex cryostat shapes requires intricate operations, for example the manufacture of sub-shields, the assembly of these sub-shields, for example by soldering, etc. The realisation by application of a lacquer-like electrically conductive shielding material, for example on the basis of silver, is simpler; via the number of applied layers and the temperature of the drying process, the desired sheet resistance can be obtained in a simple, deliberate manner.

An embodiment will be described in detail hereinafter with reference to a drawing. The single FIG. 1 of the drawing shows a cryostat for a SQUID-magnetometer provided with a shielding sleeve in accordance with the invention.

BRIEF DESCRIPTION OF THE DRAWING

The sole

DETAILED DESCRIPTION OF PREFERRED EMBODIMENT

Figure 1:
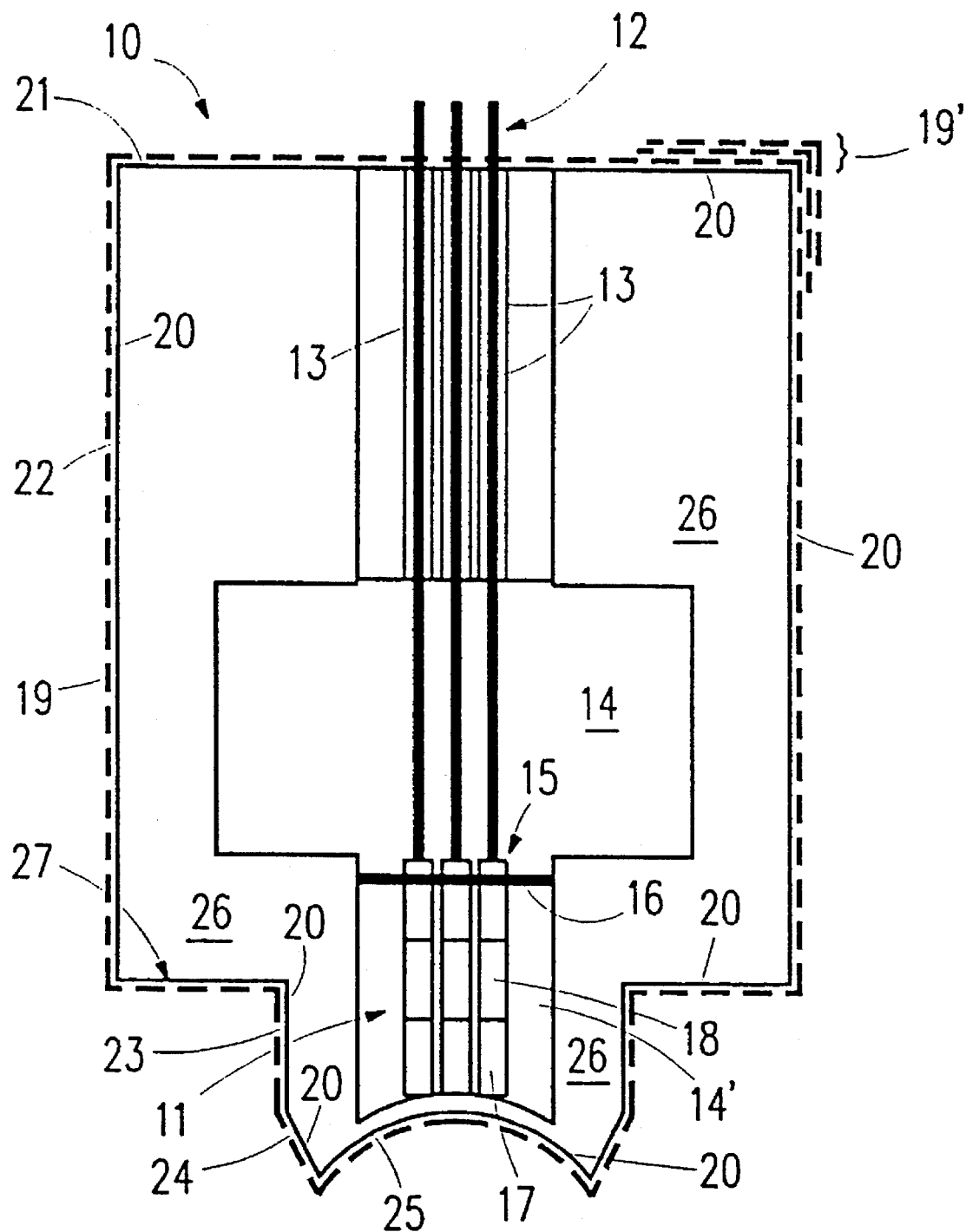
FIG. 1 shows a SQUID-magnetometer in accordance with the principles of the present invention.

Refering to the sole FIG. 1, there is illustrated a non-shielding cryostate 10, for example made of a fibreglass re-inforced synthetic material (GFK) for a multi-channel SQUID-magnetometer 11 whose terminals 12 are guided, via a guide tube 13, into a helium-filled space 14, in the lower pan 14' of which there are situated the actual SQUID housings 15 which are secured by way of an apertured guide plate 16 and accommodate inter alia the actual gradiometers 17 and an adapter 18.

The outer surface 20 of the cryostat 10 to be provided with a shielding sleeve 19 in accordance with the invention may be shaped, for example basically as a cylinder and may comprise an upper lid 21 (viewed in FIG. 1), an upper, wider cylindrical section 22, a disc-like section 27, a lower, narrow cylindrical section 23 and, via a tapered section 24, a section 25 which is shaped as a segment of sphere.

Under the lower section 25 there may be positioned, for example a human head to be examined. As is customary, the cryostat has a double-walled construction and hence comprises a vacuum insulating layer 26. In a cryostat 10 as shown in FIG. 1, in the lower coil of the gradiometer 17, situated at a distance of from approximately 1 to 2 cm from the spherical section 25 of the lower portion of the cryostat 10 there is induced a noise flux which in total corresponds to the desired value of the field noise, approximately three quarters stemming from the section 25 and one quarter from the cylindrical section 23, including the taper 24. Because they are situated at a greater distance, the other sections 21, 22 and the ring-shaped section 27 make a substantially smaller contribution to the overall noise.

For this geometry the noise contribution is proportional to $R^{-1/2}$. When a 10% increase of the system noise due to the shielding sleeve 19 in accordance with the invention is allowed, the noise contribution of the shielding sleeve 19 should be reduced to 46% of the basic noise. Because the noise contributions are added in a square law manner, in the present system, with 10 fT/HZ$^{1/2}$ in the absence of RF interference, an allowed noise contribution of from 4 to 5 fT/Hz$^{1/2}$ results. This is achieved in accordance with the invention in that the sheet resistance is between approximately 50 and 70mΩ/□ in the case of an increase by 10%, the shielding sleeve being realized on the outer surface 20 of the cryostat 10 in a reproducible and uniform manner. A different permissible increase results in a different range of sheet resistance which can be predetermined. As a result of the shielding sleeve 19 in accordance with the invention, eddy currents also become negligibly small.

The sheet resistance can be realised, for example by means of a shielding material such as foils of a synthetic material or of copper, having a thickness of approximately 0.3 μm or of aluminium having a thickness of approximately 0.6 μm. Metal foils, however, have the drawback that the formation of a closed sleeve on a cryostat which does not have a simple shape, for example the cryostat 10, requires intricate operations (for example, the formation of sub-foils, the assembly of the latter by, for example soldering, etc). Simpler is the realisation by application of electrically conductive lacquer-like layer material 19, for example on the basis of silver; via the number of layers of lacquer and the temperature of the drying process, simple adjustment of the desired sheet resistance is also possible.

The shielding sleeve 19 in accordance with the invention thus has a sheet resistance of from approximately 50 to 70 mΩ/□, applied as a single layer or as a number of layers as denoted by several dashed lines 19' at the top fight. It may be composed of an electrically conductive, lacquer-like material, for example on the basis of silver, but also of the previously mentioned metal foils. Also feasible are combinations of sub-foils and lacquer-like layer materials with an overall sheet resistance of from approximately 50 to 70 mΩ/□. The lacquer-like layer material can be applied, for example in layers or be sprayed and dried, an overall sheet resistance of from approximately 50 to 70mΩ/□ again being required in the case of several layers.

The shielding sleeve 19 in accordance with the invention thus forms a closed RF shield for the entire cryostat 10, which shield can even be provided on existing cryostats by way of a simple operation, as opposed to prior art, for example in accordance with said JP-A-62-175681 or EP-A1-0 401 420 where it can be provided only during manufacture of the cryostat. The additional noise caused by the shielding sleeve 19 in accordance with the invention is negligibly small, as has already been explained.

The features of the invention as disclosed in the foregoing description, in the Figure as well as in the claims can be of essential importance both individually as well as in arbitrary combinations for implementation of the various embodiments of the invention.

We claim:

1. A SQUID-magnetometer comprising a shielding sleeve which serves to shield the magnetometer from electromagnetic interference fields the shielding sleeve comprising a shielding layer consisting of one layer or several sub-layers of electrically conductive shielding material which fully encloses a non-shielding cryostat and which shielding layer has a predetermined sheet resistance value in the range of approximately 50 to 70 mΩ/□ such that an increase of overall magnetometer noise is substantially avoided.

2. A magnetometer as claimed in claim 1 characterized in that the material of the shielding layer is composed of an electrically conductive, lacquer-like shielding material.

3. A magnetometer as claimed in claim 2, characterized in that a plurality of layers of lacquer-like shielding material have been applied individually by brush or by spraying, followed by drying, said plurality of layers together having an overall sheet resistance value of from approximately 50 to 70 mΩ/□.

4. A magnetometer as claimed in claim 1, characterized in that the shielding layer comprises only one copper foil having a thickness of approximately 0.3 μm.

5. A magnetometer as claimed in claim 1, characterized in that the shielding layer consists of only one aluminium foil having a thickness of approximately 0.6 μm.

6. A magnetometer as claimed in claim 4, characterized in that the shielding layer comprises several sub-layer which are soldered to one another.

7. A magnetometer as claimed in claim 1, characterized in that the shielding layer per layer comprises of an electrically conductive foil of a synthetic material.

8. A magnetometer as claimed in claim 1 characterized in that the shielding layer comprises combination of metal foils and lacquer-like layer material having an overall sheet resistance value of from approximately 50 to 70 mΩ/□.

9. A magnetometer as claimed in claim 5 characterized in that the shielding layer comprises several sub-layers which are soldered to one another.

10. A magnetometer as claimed in claim 8, characterized in that the shielding layer is composed of an electrically conductive, lacquer-like shielding material containing silver.

\* \* \* \* \*